(12) United States Patent
Kirkorian

(10) Patent No.: US 7,394,170 B2
(45) Date of Patent: Jul. 1, 2008

(54) RECONFIGURABLE BACKPLANE POWER DISTRIBUTION

(75) Inventor: Barry Kirkorian, Raymond, NH (US)

(73) Assignee: Sanmina-SCI Corporation, San Jose, CA (US)

( * ) Notice: Subject to any disclaimer, the term of this patent is extended or adjusted under 35 U.S.C. 154(b) by 14 days.

(21) Appl. No.: 11/110,600

(22) Filed: Apr. 19, 2005

(65) Prior Publication Data

US 2006/0232134 A1 Oct. 19, 2006

(51) Int. Cl.
*H02J 1/00* (2006.01)
*H02J 7/00* (2006.01)
(52) U.S. Cl. ............................................ 307/69; 307/65
(58) Field of Classification Search ................... 307/65, 307/69, 55, 86, 38
See application file for complete search history.

(56) References Cited

U.S. PATENT DOCUMENTS

| | | | | |
|---|---|---|---|---|
| 5,380,216 A | * | 1/1995 | Broeksteeg et al. | 439/352 |
| 5,831,346 A | * | 11/1998 | Baumann et al. | 307/64 |
| 6,066,900 A | * | 5/2000 | Chan et al. | 307/38 |
| 6,282,599 B1 | * | 8/2001 | Gallick et al. | 710/306 |
| 6,489,748 B1 | * | 12/2002 | Okamura | 320/116 |
| 6,677,687 B2 | * | 1/2004 | Ho et al. | 307/43 |
| 6,833,634 B1 | * | 12/2004 | Price | 307/18 |
| 7,141,893 B2 | * | 11/2006 | Hanahan et al. | 307/64 |

* cited by examiner

*Primary Examiner*—Michael Sherry
*Assistant Examiner*—Michael Rutland-Wallis
(74) *Attorney, Agent, or Firm*—Perkins Coie, LLP

(57) ABSTRACT

A backplane system for reconfigurable backplane power distribution includes circuit board slots, power entry modules, power distribution circuitry, and switching circuitry. The power distribution circuitry includes a first power configuration and a second power configuration and distributes the power from the power entry modules to at least one circuit board plugged into one of the circuit board slots. The switching circuitry switches between the first power configuration and the second power configuration to provide extended power capabilities.

26 Claims, 8 Drawing Sheets

RECONFIGURABLE BACKPLANE POWER DISTRIBUTION

BACKGROUND

1. Technical Field

The present invention relates generally to backplanes and more particularly to reconfigurable backplane power distribution.

2. Description of Related Art

A computing shelf generally includes a backplane into which circuit boards are plugged. The backplane is an electronic board containing circuitry and slots for the circuit boards. The backplane may also include slots for input/output (I/O), switching fabrics, synchronization clocks, system management circuitry, and power distribution circuitry. Some backplanes support hot swapping of the plugged-in circuit boards, for example, in large pools of digital signal processors (DSPs) and storage arrays. The backplane layout and circuitry typically dictate the manner in which power is distributed to the circuit boards and the interaction between the circuit boards and the backplane.

In one example, the PCI Industrial Computer Manufacturers Group (PICMG) provides a specification for a telecommunication computing shelf and backplane. This specification, called the PICMG 3.0 Advanced Telecommunications Computing Architecture (ATCA), defines an ATCA computing shelf, an ATCA backplane, and the requirements for the circuit boards when plugged into the ATCA backplane. In particular, the ATCA backplane includes power distribution circuitry that distributes dual independent power feeds from two power entry modules to the circuit boards plugged into circuit board slots on the ATCA backplane. Each circuit board slot receives the power primarily from the first power entry module. Each circuit board slot also receives the power secondarily from the second power entry module. The ATCA backplane is capable of dissipating as much as 200 watts per single-slot circuit board in addition to the power consumption requirements of fans and other ATCA shelf circuitry. In a 16-slot ATCA backplane, over 3200 watts of power must be provided such that each single-slot circuit board may receive the maximum of 200 watts. Circuit boards may occupy more than one circuit board slot to receive more than the maximum 200 watts.

One problem with the ATCA backplane is that the backplane is not designed to support circuit boards requiring more power than the 200 watts per circuit board slot. Circuit boards needing more power may occupy more than one circuit board slot. This, however, may reduce the functionality of the entire ATCA shelf because there are fewer slots available for other circuit boards. Another problem with the ATCA backplane, and backplanes in general, is the time and expense required to upgrade the backplane to support newer circuit boards that require greater power dissipation. Once the backplane is mounted within the computing shelf and the computing shelf is installed on-site, the entire backplane must be replaced with a new backplane that supports the power requirements of the newer circuit boards.

SUMMARY OF THE INVENTION

The invention addresses the above problems by providing reconfigurable backplane power distribution. A backplane system for reconfigurable backplane power distribution includes circuit board slots, power entry modules, power distribution circuitry, and switching circuitry. The power distribution circuitry includes a first power configuration and a second power configuration. The power distribution circuitry distributes the power from the power entry modules to at least one circuit board plugged into one of the circuit board slots. The switching circuitry switches between the first power configuration and the second power configuration to provide extended power capabilities to circuit boards requiring additional power.

In some embodiments, the circuit board slots are partitioned into a first power zone and a second power zone in the first power configuration. The backplane system may be switched to the second power configuration such that the circuit board slots are partitioned into a first power zone, a second power zone, and a third power zone. The circuit board slots receive the power primarily from a first power entry module and secondarily from a second power entry module. The power distribution circuitry may include a power configuration module that distributes the power to the circuit board slots when the backplane system operates in the first power configuration. Additionally, the switching circuitry may comprise a jumper for switching between the first power configuration and the second power configuration.

The backplane system advantageously provides an alternative to replacing an entire backplane to support circuit boards requiring extended power capabilities. Downtime is reduced because the backplane is not replaced but rather switched to the power configuration offering extended power capabilities. Further, each circuit board plugged into the backplane system does not have to be removed from the backplane to switch power configurations. Additionally, there is a cost savings associated with the reconfiguration backplane power distribution in being able to switch between power configurations versus replacing the entire backplane.

DETAILED DESCRIPTION OF THE INVENTION

The embodiments discussed herein are illustrative of one example of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings should not be considered in a limiting sense, as it is understood that the present invention is in no way limited to only the embodiments illustrated.

To provide reconfigurable backplane power distribution, a backplane system includes power distribution circuitry having a first power configuration and a second power configuration. The power distribution circuitry distributes the power from power entry modules to at least one circuit board plugged into the backplane. The first power configuration and the second power configuration configure the mode by which the power distribution circuitry distributes the power for use by the plugged-in circuit boards. The backplane system also includes switching circuitry that switches the power distribution circuitry between the first power configuration and the second power configuration. Advantageously, the backplane system may operate in the first power configuration and the second power configuration without replacement of the entire power distribution circuitry.

The invention will now be described according to an example for an ATCA shelf and backplane, however, it should be recognized that the example is intended to illustrate and not limit the present invention. In this example, a manufacturer configures the backplane system in the first power configuration and installs two power entry modules to power circuit boards with a maximum power dissipation of 200 watts. When newer circuit boards requiring additional power are to be added to the backplane system, a user switches the backplane system to the second power configuration. The user adds a third power entry module to provide the extended power. Now circuit boards requiring a maximum power dissipation of 200 watts or 300 watts may operate within the backplane system. The backplane system may be reconfigured without removal of the circuit boards and/or replacement of the power distribution circuitry (i.e., or the entire backplane) in the backplane system.

Figure 1:
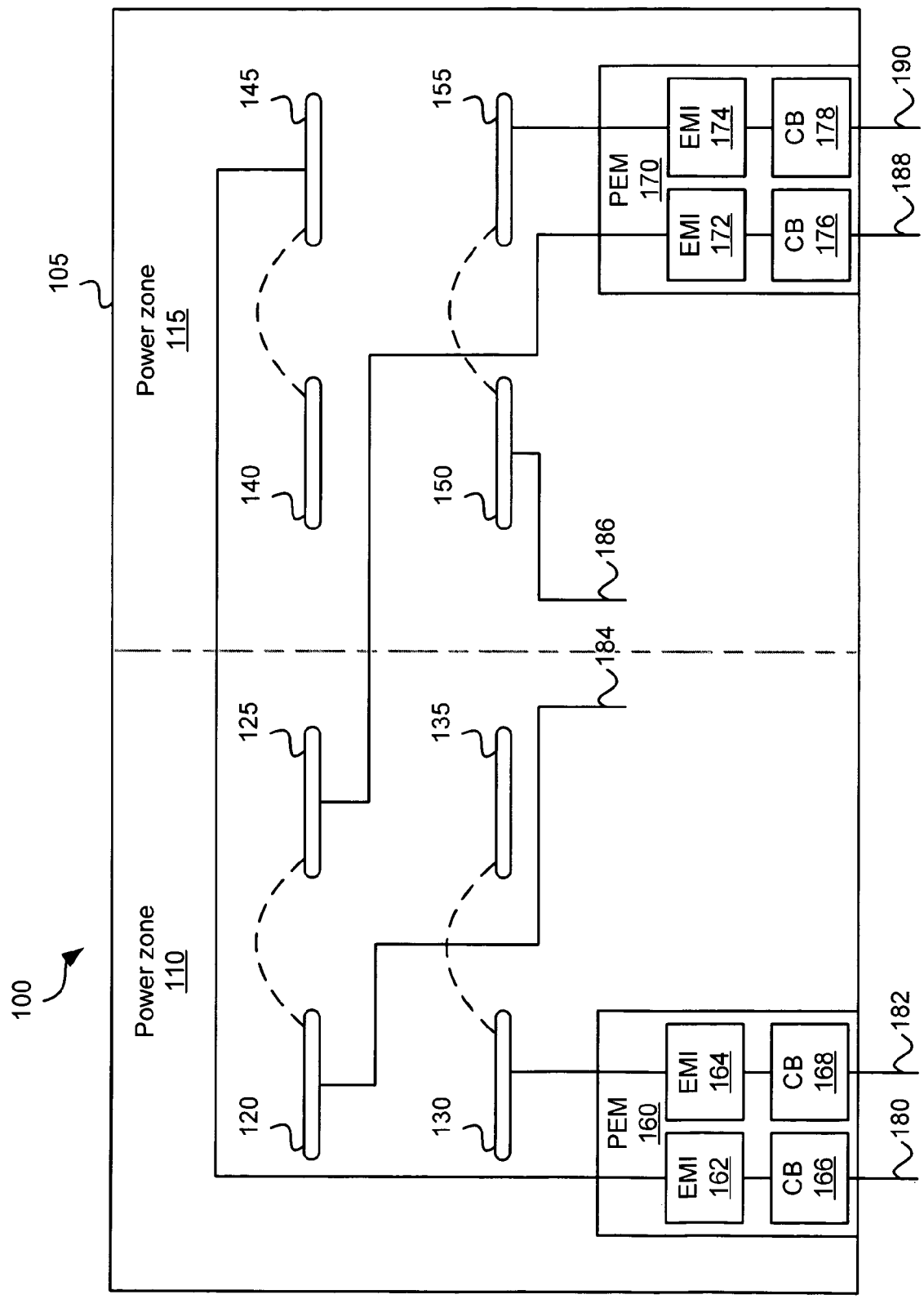
FIG. 1 is an illustration depicting a backplane system with power distribution circuitry in a first power configuration in an exemplary implementation of the invention.

FIG. 1 is an illustration depicting a backplane system 100 with power distribution circuitry in a first power configuration in an exemplary implementation of the invention. The backplane system 100 includes a backplane 105 having a power zone 110 and a power zone 115. The power zone 110 includes a power distribution terminal 120, a power distribution terminal 125, a power distribution terminal 130, a power distribution terminal 135, and a power entry module 160. The power zone 115 includes a power distribution terminal 140, a power distribution terminal 145, a power distribution terminal 150, a power distribution terminal 155, and a power entry module 170.

The power entry module 160 includes an electromagnetic interference (EMI) filter 162, an EMI filter 164, a circuit breaker 166, and a circuit breaker 168. The power entry module 170 includes an EMI filter 172, an EMI filter 174, a circuit breaker 176, and a circuit breaker 178.

The power distribution terminal 120 is linked (represented by the dashed arc line) to the power distribution terminal 125. The power distribution terminal 125 is linked to the EMI filter 172 in the power entry module 170. The EMI filter 172 is linked to the circuit breaker 176. The circuit breaker 176 is linked to one or more external power sources via line 188.

The power distribution terminal 130 is linked (represented by the dashed arc line) to the power distribution terminal 135. The power distribution terminal 130 is also linked to the EMI filter 164 in the power entry module 160. The EMI filter 164 is linked to the circuit breaker 168. The circuit breaker 168 is linked to the one or more external power sources via line 182.

The power distribution terminal 140 is linked (represented by the dashed arc line) to the power distribution terminal 145. The power distribution terminal 145 is linked to the EMI filter 162 in the power entry module 160. The EMI filter 162 is linked to the circuit breaker 166. The circuit breaker 166 is linked to the one or more external power sources via line 180.

The power distribution terminal 150 is linked (represented by the dashed arc line) to the power distribution terminal 155. The power distribution terminal 155 is linked to the EMI filter 174 in the power entry module 170. The EMI filter is linked to the circuit breaker 178. The circuit breaker 178 is linked to the one or more external power sources via line 190.

The power distribution terminal 120 may be linked via line 184 to an additional power entry module as discussed below in FIG. 2. Similarly, the power distribution terminal 150 may be linked via line 186 to the additional power entry module.

Each power distribution terminal (e.g., power distribution terminals 120, 125, 130, 135, 140, 145, 150, and 155) is coupled to one or more circuit board slots (not shown) of the backplane 105. Each circuit board slot is coupled to at least two power distribution terminals. Then two power distribution terminals provide dual independent power to the circuit boards plugged into the circuit board slot. In this example, the power distribution terminal 130 provides the power primarily to one circuit board slot. Additionally, the power distribution terminal 120 provides the power secondarily to the one circuit board slot.

The backplane 105 is any electronic board into which circuit boards are plugged for power and communication. The power distribution circuitry is any circuitry in the backplane 105 that distributes the power between the power entry modules and the circuit boards. In this example, the power distribution circuitry comprises the power distribution terminals 120, 125, 130, 135, 140, 145, 150, 155, the links between the power distribution terminals themselves, the links between the power distribution terminals and the circuit board slots, and the links between the power distribution terminals and the power entry modules. Other examples of the power distribution circuitry are described below in FIGS. 5 and 6.

The power distribution circuitry includes at least two power configurations. The first power configuration and the second power configuration configure the mode by which the power distribution circuitry distributes the power for use by the plugged-in circuit boards. Each power configuration defines the electrical properties, requirements, and/or circuitry of the backplane system for power usage of the circuit boards. In this example, the first power configuration provides a nominal operating input voltage of −48 volts DC from the power entry modules 160 and 170. The first power configuration provides that the power distribution circuitry distribute the power to the circuit board slots partitioned into the power zone 110 and the power zone 115. A maximum power of 200 watts is allowed for each single-slot circuit board. The second power configuration provides the nominal operating input voltage of −48 volts DC, but from three power entry modules instead of two. The power distribution circuitry distributes the power to the circuit board slots that are partitioned into three power zones instead of two. A maximum power of 300 watts is allowed for each single-slot circuit board.

The switching circuitry is any circuitry or device in the backplane 105 that switches between the first power configuration and the second power configuration of the power distribution circuitry. Some examples of the switching circuitry are slide bars, toggles, rotary switches, rockers, levers, or pushbutton switches. Other examples of the switching circuitry are described below in FIGS. 7 and 8. In some embodiments, the switching circuitry switches between two or more power configurations. The switching circuitry may also be controlled by software rather than mechanically. For instance, a multiplexer may be sent a control signal to switch between two or more power configurations. It should be noted that the switching circuitry may not only switch from the first power configuration to the second power configuration, but also switch in the reverse. The switching circuitry may switch from the second power configuration to the first power configuration.

Power zone 110 defines how one or more of the circuit board slots are partitioned to receive the power primarily from the power entry module 160 through the power distribution terminals 130 and 135. Additionally, the power zone 110 defines how the one or more of the circuit board slots receive the power secondarily through the power distribution terminals 120 and 125 from the power entry module 170. Similarly, power zone 115 defines how one or more of the circuit board slots are partitioned to receive the power primarily through the power distribution terminals 150 and 155 from the power entry module 170. The one or more circuit board slots receive the power secondarily through the power distribution terminals 140 and 145 from the power entry module 160.

The power distribution terminals 120, 125, 130, 135, 140, 145, 150, and 155 are any circuitry in the backplane 105 that distributes the power between the power entry modules 160 and 170 and the circuit board slots. An example of the power distribution terminals 120, 125, 130, 135, 140, 145, 150, and 155 is an electronically independent copper strip coupled between one of the circuit board slots and the power entry modules 160.

The power entry module 160 and the power entry module 170 are any circuitry, devices, or systems that receive the power from power sources, provide electromagnetic interference filtering and over current protection, and provide the power to the power distribution circuitry. The power entry modules 160 and 170 are typically individual units coupled to the backplane 105.

In the first power configuration, the backplane 105 operates in the following manner. The power entry modules 160 and 170 are coupled to the backplane 105 to provide the dual independent power feeds to each circuit board plugged into the circuit board slots of the backplane 105. A first circuit board slot in the power zone 110 is coupled to the power distribution terminal 120 and to the power distribution terminal 130. The first circuit board slot receives the power primarily from the power entry module 160 via the power distribution terminal 120 and the power secondarily from the power entry module 170 via the power distribution terminal 130.

The power to the first circuit board slot is shared with seven other circuit board slots in the power zone 110. In particular, the first circuit board slot and three other circuit board slots are coupled to the power distribution terminal 120 and the power distribution terminal 130. The remaining four other circuit board slots are coupled to the power distribution terminal 125 and the power distribution terminal 135. Because all eight circuit board slots share the power from the power entry modules, circuit boards plugged into one of the eight circuit board slots are limited by the power draw of the other eight plugged in circuit boards. The first power configuration limits each circuit board to a maximum power dissipation of 200 watts.

Figure 2:
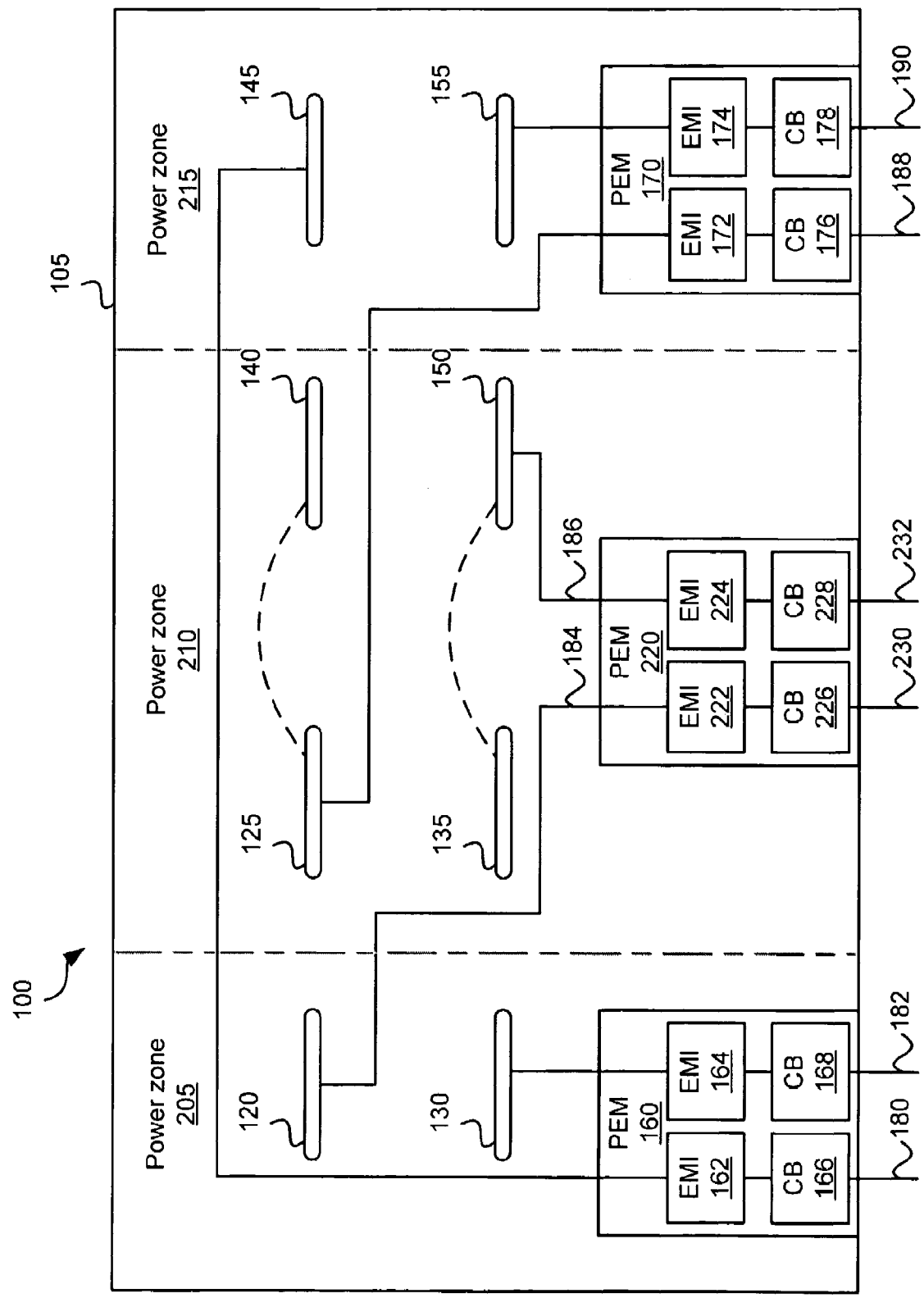
FIG. 2 is an illustration depicting the backplane system with the power distribution circuitry in a second power configuration in an exemplary implementation of the invention.

FIG. 2 is an illustration depicting the backplane system 100 with the power distribution circuitry in a second power configuration in an exemplary implementation of the invention. The backplane system 100 includes the backplane 105 having a power zone 205, a power zone 210, and a power zone 215. The power zone 205 includes the power distribution terminal 120, the power distribution terminal 130, and the power entry module 160. The power zone 210 includes the power distribution terminal 125, the power distribution terminal 135, the power distribution terminal 140, the power distribution terminal 150, and a power entry module 220. The power zone 215 includes the power distribution terminal 145, the power distribution terminal 155, and the power entry module 170. The power entry module 220 includes an EMI filter 222, an EMI filter 224, a circuit breaker 226, and a circuit breaker 228.

In the power zone 205, the power distribution terminal 120 is linked to the EMI filter 222 in the power entry module 220 via the line 184. The EMI filter 222 is linked to the circuit breaker 226. The circuit breaker 226 is linked to the one or more external power sources via line 230. The power distribution terminal 130 is linked to the EMI filter 164 in the power entry module 160.

In the power zone 210, the power distribution terminal 125 is linked (represented by the dashed arc line) to the power distribution terminal 140. The power distribution terminal 125 is linked to the EMI filter 172 in the power entry module 170. The power distribution terminal 135 is linked (represented by the dashed arc line) to the power distribution terminal 150. The power distribution terminal 150 is linked to the EMI filter 224 in the power entry module 220. The EMI filter 224 is linked to the circuit breaker 228. The circuit breaker 228 is linked to the one or more external power sources via line 232. In the power zone 215, the power distribution terminal 145 is linked to the EMI filter 162 in the power entry module 160. The power distribution terminal 155 is linked to the EMI filter 174 in the power entry module 170.

The power zone 205, the power zone 210, and the power zone 215 again refer to how the circuit boards are partitioned for the purposes of receiving the power from the power entry modules 160, 170, and 220. In this example, one or more circuit board slots are partitioned in the power zone 205 to receive the power primarily from the power entry module 160 and the power secondarily from the power entry module 220. The circuit board slots partitioned into the power zone 210 receive the power primarily from the power entry module 220 and the power secondarily from the power entry module 170. The circuit board slots partitioned into the power zone 215 receive the power primarily from the power entry module 170 and the power secondarily from the power entry module 160.

In operation, the first circuit board slot coupled to the power distribution terminal 120 and the power distribution terminal 130 is now partitioned into the power zone 205. The first circuit board slot shares the power from the power-entry module 160 and the power entry module 220 with the three other circuit board slots also coupled to the power distribution terminals 120 and 130. This is in contrast to the example shown in FIG. 1 where the first circuit board slot shared the power with the seven other circuit board slots. Because the first circuit board slot may receive ¼ of the power instead of ⅛ of the power, circuit boards plugged into the first circuit board slot may dissipate more power. In the second power configuration, the circuit boards may dissipate a maximum power of 300 watts.

If the backplane 105 had 16 circuit board slots, the power zone 205 and the power zone 215 would each include four circuit board slots. Circuit boards plugged into the circuit board slots partitioned into the power zone 205 and the power zone 215 may dissipate the maximum power of 300 watts. The power zone 210, however, includes the remaining eight circuit board slots. This allows circuit boards having a lighter power load to be placed in the center circuit board slots of the backplane 105. Placement in the center circuit board slots balances the power distribution because the lighter power load circuit boards may not require more than the maximum power of 200 watts.

Adding the power entry module 220 and reconfiguring the power distribution circuitry into the second power configuration advantageously provides the additional power required by the circuit boards having extended power capabilities. The backplane 105 does not have to be completely replaced to reconfigure the power distribution circuitry. This saves time and expense in removing circuit boards plugged into the backplane 105. Downtime is also mitigated because the time to switch between the power configurations may be quick as flipping a switch and adding a third power entry module. Additionally, the backplane system 100 provides a cost savings by having one backplane that performs multiple power distribution functions.

In some embodiments, the power distribution circuitry of the backplane 105 includes three or more power configurations. Each power configuration may be selected to choose a different mode at which the power distribution circuitry distributes the power for use by the circuit board slots. In a 16-slot backplane, a first mode may provide all 16 slots a maximum power of 200 watts. A second mode may provide the four outer left and outer right slots a maximum power of 300 watts. The eight middle slots are provided a maximum power of 200 watts. A third mode may provide all 16 slots a maximum power dissipation of 300 or more watts.

In some embodiments, the backplane 105 includes three or more power zones. The three or more power zones may partition to circuit board slots in various manners. For example, instead of partitioning the slots sequentially, one power zone may represent even numbered circuit board slot while another power configuration represents the odd numbered circuit board slots.

Figure 3:
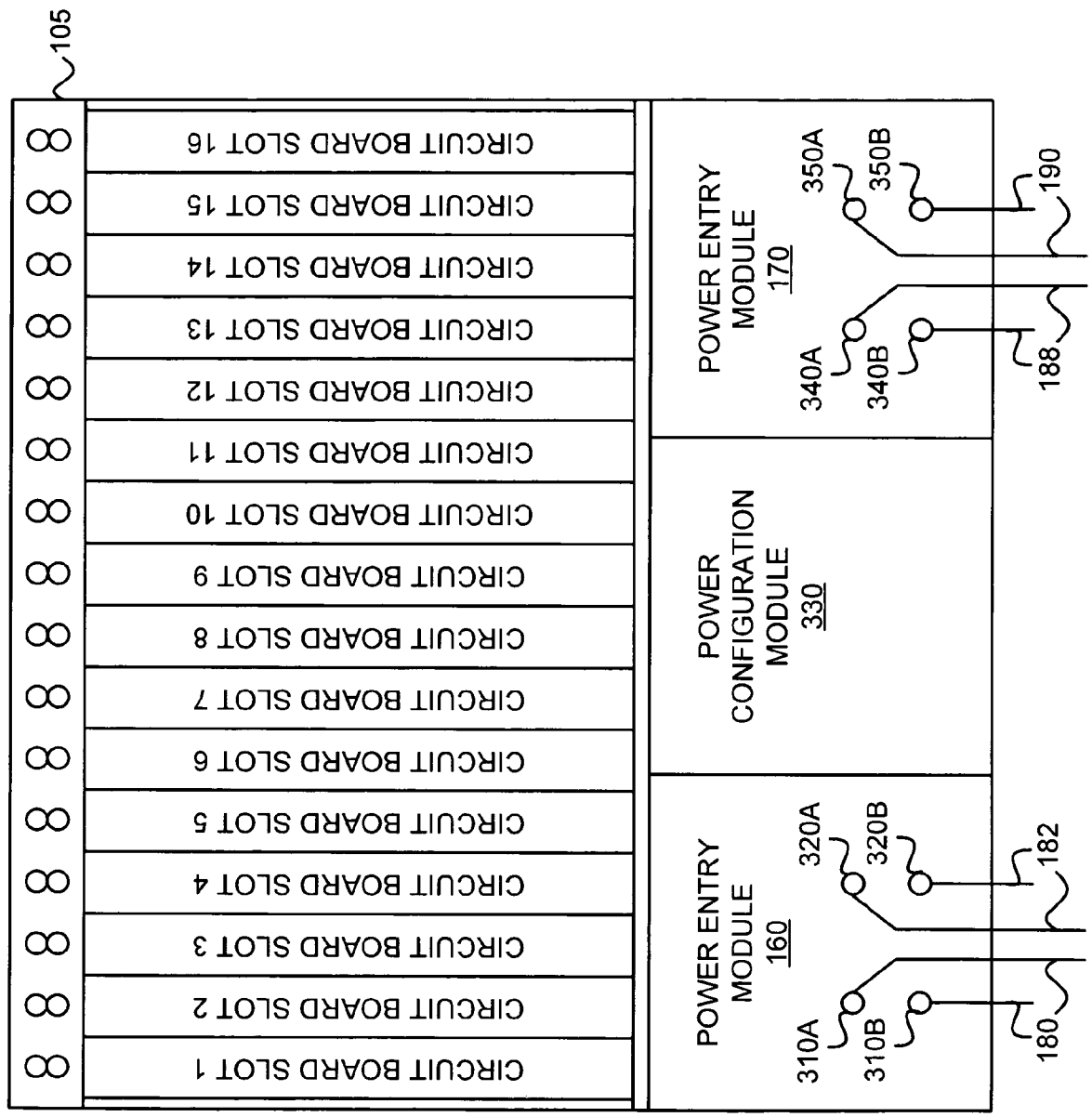
FIG. 3 is an illustration of a rear view depicting a backplane configured in the first power configuration in an exemplary implementation of the invention.

FIG. 3 is an illustration of a rear view depicting the backplane 105 configured in the first power configuration in an exemplary implementation of the invention. The backplane 105 includes circuit board slots, the power entry module 160, the power entry module 170, and a power configuration module 330.

The power entry module 160 includes a power input terminal 310A, a power input terminal 310B, a power return terminal 320A and a power return terminal 320B. The power entry module 170 includes a power input terminal 340A, a power input terminal 340B, a power return terminal 350A, and a power return terminal 350B.

The power entry module 160 is linked to the one or more external power sources via the lines 180 and 182. The line 180 is linked to the power input terminal 310A and the power input terminal 310B. The line 182 is linked to the power return terminal 320A and the power return terminal 320B. The power entry module 170 is linked to the one or more external power sources via the lines 188 and 190. The line 188 is linked to the power input terminal 340A and the power input terminal 340B. The line 190 is linked to the power return terminal 350A and the power return terminal 350B.

The power configuration module 330 plugs into a power configuration module slot (not shown) on the backplane 105. The power configuration module 330 is any circuitry, device, or system that reconfigures the power distribution circuit when attached to the backplane 105. In this example, the power configuration module 330 reconfigures the power distribution circuitry to partition the circuit board slots into the power zone 110 and the power zone 115. One example of the power configuration module is described below in FIG. 5.

The manufacturer may pre-configure the backplane 10S in the first power configuration by installing the power entry module 160, the power entry module 170, and the power configuration module 330. During operation, the power configuration module 330 configures the links between the power distribution terminal 120, the power distribution terminal 125, the power distribution terminal 130, the power distribution terminal 135, the power distribution terminal 140, the power distribution terminal 145, the power distribution terminal 150, and the power distribution terminal 155. Further, the circuit boards plugged into the circuit board slots receive a maximum power of 200 watts from the power entry module 160 and the power entry module 170.

Figure 4:
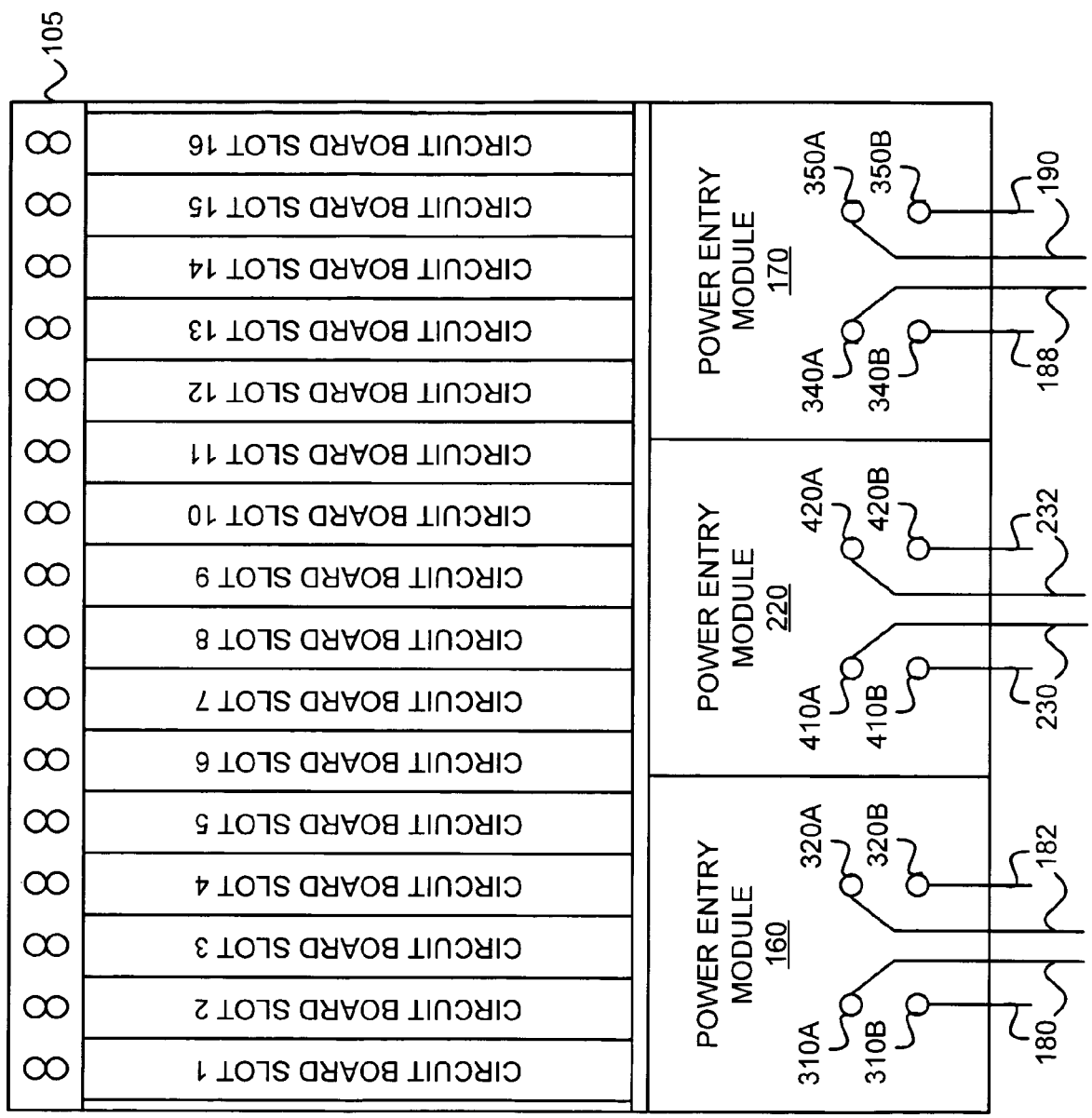
FIG. 4 is an illustration of a rear view depicting the backplane configured in the second power configuration in an exemplary implementation of the invention.

FIG. 4 is an illustration of the rear view depicting the backplane 105 configured in the second power configuration in an exemplary implementation of the invention. The power configuration module 330 has been removed from the backplane 105 and replaced with the power entry module 220. The power entry module 220 includes a power input terminal 410A, a power input terminal 410B, a power return terminal 420A, and a power return terminal 420B.

The power entry module 220 is linked to one or more of the power sources via the lines 230 and 232. The line 230 is linked to the power input terminal 410A and the power input terminal 410B. The line 232 is linked to the power return terminal 420A and the power return terminal 420B.

When the user reconfigures the backplane 105, the user removes the power configuration module 330. The user then attaches the power entry module 220. The user operates the switching circuitry to switch the power distribution circuitry from the first power configuration to the second power configuration. The circuit board slots are now partitioned into the power zone 205, the power zone 210, and the power zone 215. Circuit boards plugged into the backplane 105 may now draw up to a maximum power of 300 watts with the addition of the power entry module 220.

Advantageously, the backplane 105 and the circuit boards plugged into the backplane 105 need not be removed when the backplane 105 is switched between power configurations. This allows the backplane 105 to be quickly introduced back into service after the process of reconfiguration.

Figure 5:
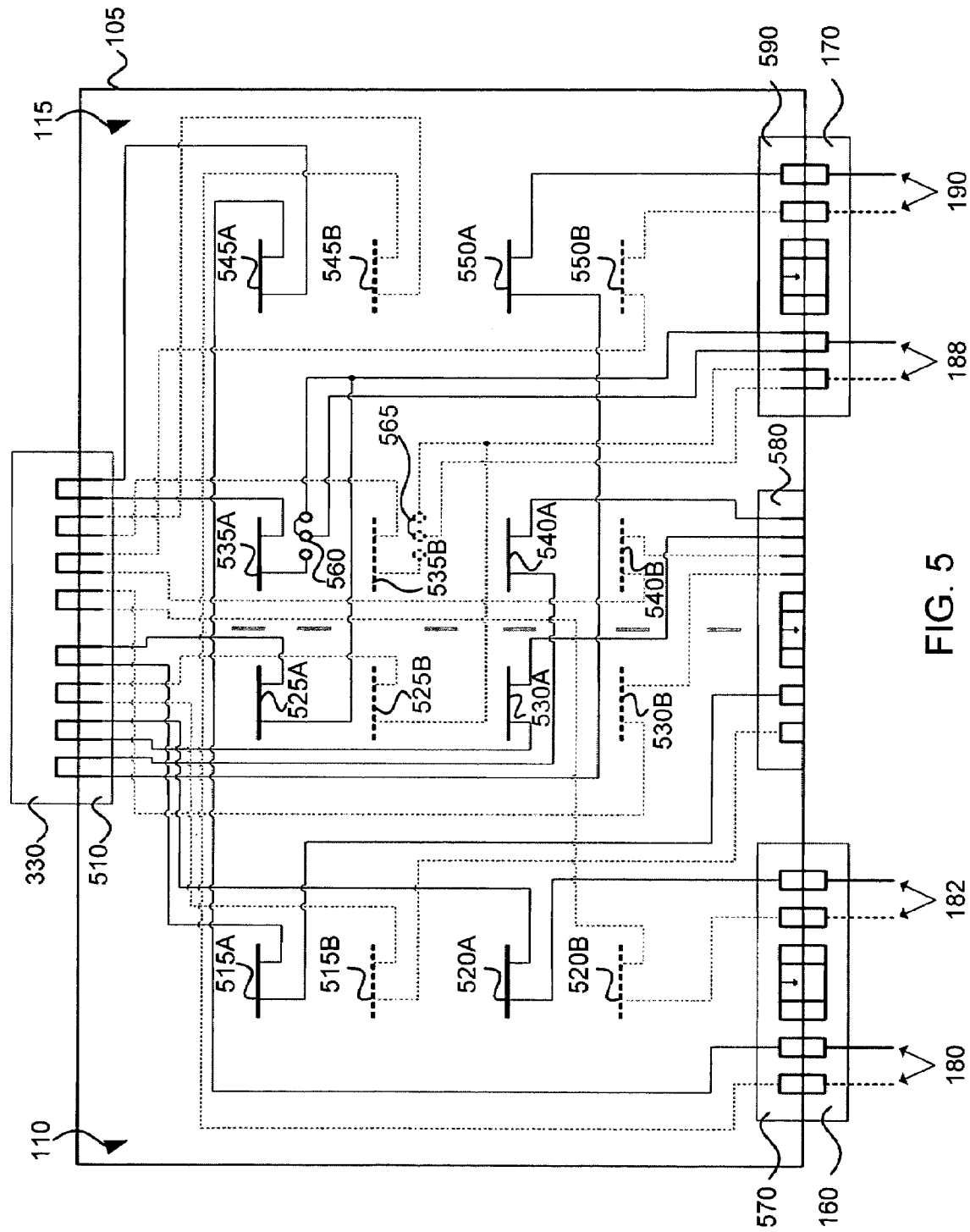
FIG. 5 is an illustration depicting power distribution circuitry of the backplane configured in the first power configuration in an exemplary implementation of the invention.

FIG. 5 is an illustration depicting the power distribution circuitry of the backplane 105 configured in the first power configuration in an exemplary implementation of the invention. The backplane 105 includes the power zone 110, the power zone 115, a power configuration module slot 510, a power entry module slot 570, a power entry module slot 580, and a power entry module slot 590.

The power zone 110 includes a power distribution terminal 515A, a power distribution terminal 520A, a power distribution terminal 525A, a power distribution terminal 530A, a power distribution terminal return 515B, a power distribution terminal return 520B, a power distribution terminal return 525B, and a power distribution terminal return 530B.

The power zone 115 includes a power distribution terminal 535A, a power distribution terminal 540A, a power distribution terminal 545A, a power distribution terminal 550A, a power distribution terminal return 535B, a power distribution terminal return 540B, a power distribution terminal return 545B, a power distribution terminal return 550B, and switches 560 and 565.

The power configuration module 330 couples to the backplane 105 via the power configuration module slot 510. The power entry module 160 couples to the power entry module slot 570. The power entry module 170 couples to the power entry module slot 590.

The power distribution circuitry comprises the power distribution terminals 515A, 520A, 525A, 530A, 535A, 540A, 545A, and 550A and the power distribution return terminals 515B, 520B, 525B, 530B, 535B, 540B, 545B, and 550B. The power distribution terminals 515A, 520A, 525A, 530A, 535A, 540A, 545A, and 550A and the power distribution return terminals 515B, 520B, 525B, 530B, 535B, 540B, 545B, and 550B are analogous to the power distribution terminals 120, 125, 130, 135, 140, 145, 150, and 155 described above in FIG. 1.

The switching circuitry comprises the switches 560 and 565. The switches 560 and 565 and are any circuitry on the backplane 105 that switches or assists in switching the power distribution circuitry between the first power configuration and the second power configuration. Some examples of the switches 560 and 565 are toggles, rotary switches, rockers, levers, or pushbutton switches. One example of the switches 560 and 560 is described below in FIGS. 7 and 8.

In this example, the power configuration module 330 configures the power distribution circuitry in a manner similar to that described in FIG. 1. Specifically, the power distribution terminal 515A is linked to the power distribution terminal 525 via the power configuration module 330. The power distribution terminal return 515B is linked via the power configuration module 330 to the power distribution terminal return 525B that returns the power to the power entry module slot 590. Additionally, the switch 560 selects whether the power distribution terminal 535A distributes the power from the power entry module 160 or the power entry module 170. The switch 565 selects whether the power distribution terminal return 535B distributes the power to the power entry module 160 or the power entry module 170.

The power configuration module 330 also reconfigures the power distribution circuitry such that the circuit board slots are partitioned into the power zone 110 and the power zone 115. In the backplane 105 with 16 circuit board slots, the power configuration module 330 reconfigures the power distribution circuitry such that the power zone 110 includes eight circuit board slots and the power zone 115 includes eight circuit board slots. Each circuit board plugged into the circuit board slots is limited to a maximum power dissipation of 200 watts. As discussed previously, each circuit board shares the power with the other circuit board plugged into the remaining seven circuit board slots in each power zone.

Figure 6:
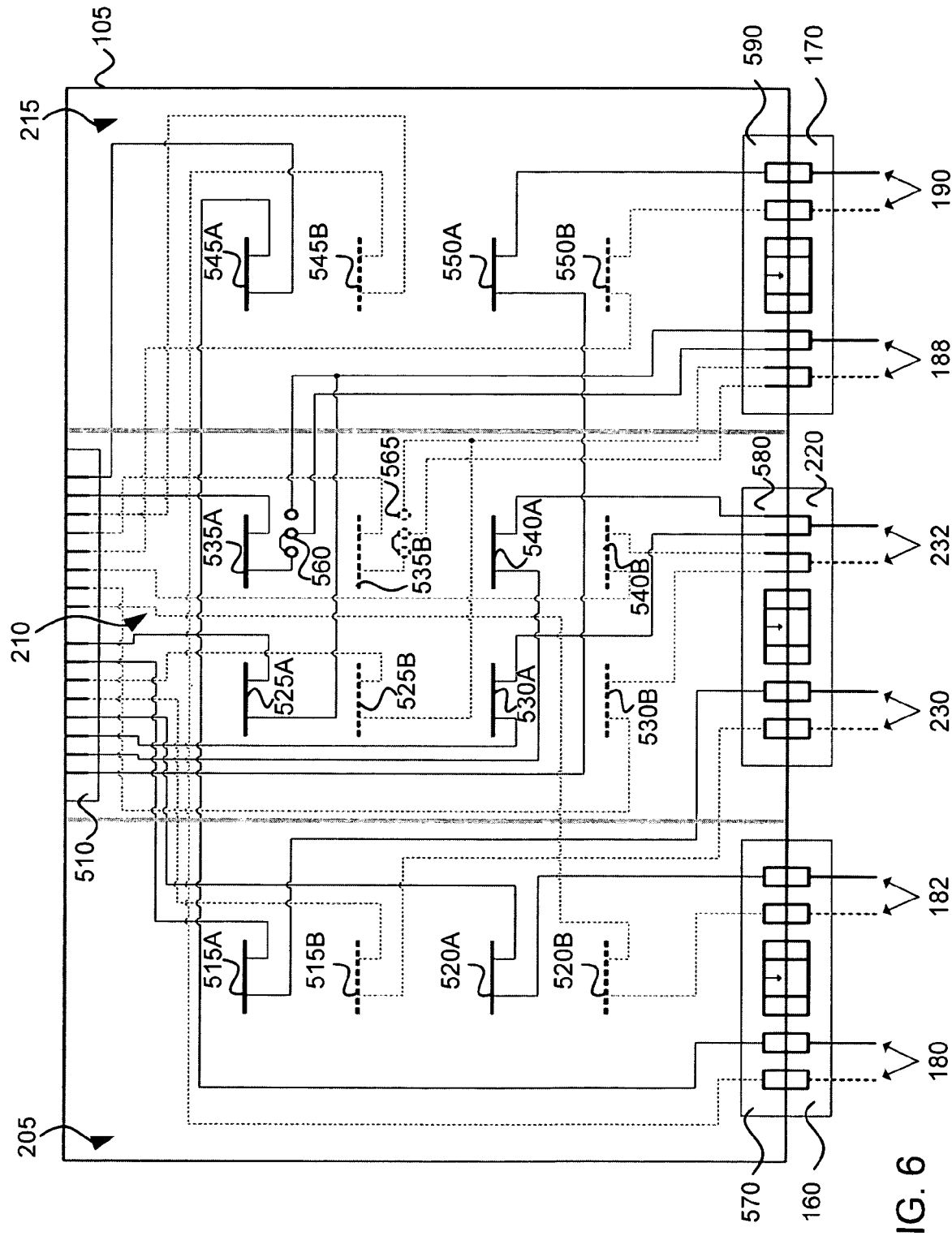
FIG. 6 is an illustration depicting the power distribution circuitry of the backplane configured in the second power configuration in an exemplary implementation of the invention.

FIG. 6 is an illustration depicting the power distribution circuitry of the backplane 105 configured in the second power configuration in an exemplary implementation of the invention. Again, the power configuration module 330 has been removed from the backplane 105. The power entry module 220 has been coupled to the power entry module slot 580.

With the power configuration module 330 detached from the backplane 105, the power distribution circuitry is reconfigured as the example described above in FIG. 2. In particular, the power distribution terminal 515A and the power distribution terminal return 515B are no longer linked to the power distribution terminal 525A and the power distribution terminal return 525B, respectively. Similarly, the power distribution terminal 520A and the power distribution terminal return 520B are no longer linked to the power distribution terminal 530A and the power distribution terminal return 530B, respectively.

Switching the switch 560 then links the power distribution terminal 535A to the power entry module slot 590. Switching the switch 565 links the power distribution terminal return 535B to the power entry module slot 590. The power distribution terminal 530A, the power distribution terminal 540A, the power distribution terminal return 530B, and the power distribution terminal return 540B are linked to the power entry module slot 580.

The addition of the power entry module 220 provides the extra power to the circuit board slots in the power zones 205 and 215. Each circuit board slot may dissipate a maximum power of 300 watts.

Figure 7:
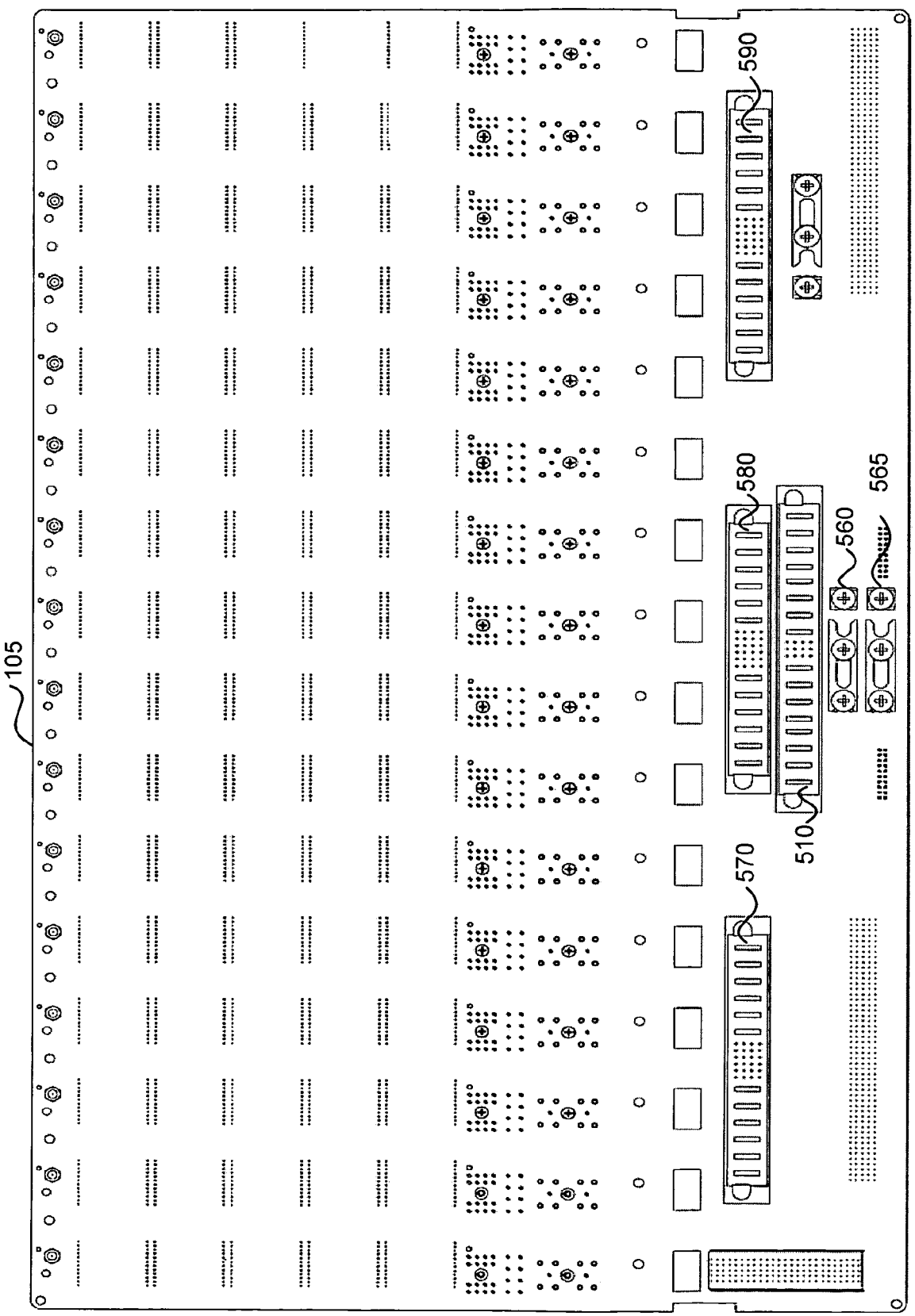
FIG. 7 is an illustration depicting the backplane of the backplane system having switching circuitry in the first power configuration in an exemplary implementation of the invention.

FIG. 7 is an illustration depicting the backplane 105 having switching circuitry in the first power configuration in an exemplary implementation of the invention. In this example, the power entry module 160 can be coupled to the power entry modules slot 570. The power entry module 170 can be coupled to the power entry module slot 590. The power configuration module 330 can be coupled to the power configuration module slot 510.

The switches 560 and 565 are conductive slide-bars that position between screw contacts. The switches 560 and 565 are positioned depending on the whether the backplane system 100 is operating in the first power configuration or the second power configuration. In this example, the switches 560 and 565 are positioned to the left in the first power configuration.

Figure 8:
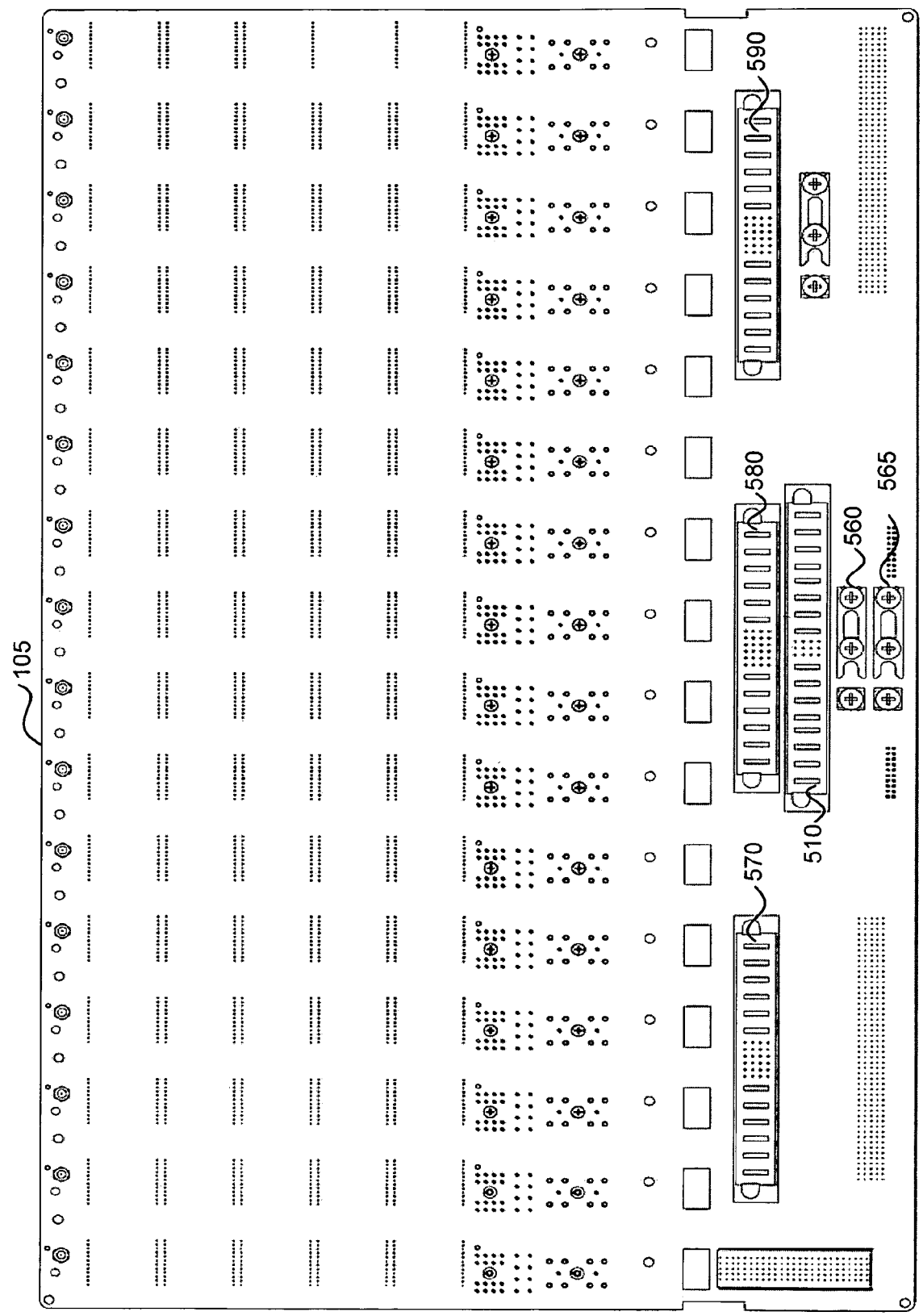
FIG. 8 is an illustration depicting the backplane of the backplane system having switching circuitry in the second power configuration in an exemplary implementation of the invention.

FIG. 8 is an illustration depicting the backplane 105 of the backplane system 100 in the second power configuration in an exemplary implementation of the invention. In this example, the power entry module 160 would be coupled to the power entry modules slot 570. The power entry module 170 would be coupled to the power entry module slot 590. The power entry module 220 would be coupled to the power entry module slot 580. In this example, the switches 560 and 565 are positioned to the right to in the second power configuration. It will be apparent to one of ordinary skill in the art from the examples of the switching circuitry presented herein that other types and forms of switching circuitry may be used. In some embodiments, the switching circuitry may be electrically switched between the first power configuration and the second power configuration.

In further embodiments, backplane system 100 includes a keying mechanism. The keying mechanism prevents coupling an incompatible device with the backplane 105 operating in the first power configuration or the second power configuration. For example, the keying mechanism may prevent coupling the power entry module 220 with the backplane 105 operating in the first power configuration. The keying mechanism protects the backplane 105 by reducing error in installing an incompatible device or module for a selected power configuration.

In one example, referring to FIG. 7, the switches 560 and 565 when positioned to the left in the first power configuration create a vertical open area to the right. The power configuration module 330 includes a vertical plastic tab positioned to match up with the vertical open area to the right. When the power configuration module 330 is coupled to the backplane 105, the vertical plastic tab inserts into the vertical open area to the right. This allows the power configuration module 330 to engage with the power configuration module slot 510 when the backplane 105 is operating in the first power configuration.

Referring now to FIG. 8, the switches 560 and 565 positioned to the right in the second power configuration create the vertical open area to the left. The power entry module 220 includes a similar vertical plastic tab as the power configuration module 330. However, the vertical plastic tab of the power entry module 220 is positioned to match up with the vertical open area to the left. This allows the power entry module 220 to engage with the power entry module slot 580 when the backplane 105 is operating in the second power configuration.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A backplane system comprising:
a backplane, including at least three power zones;
circuit board slots coupled to the backplane;
a first power entry module (PEM) and a second PEM, wherein the first PEM and the second PEM are configured to receive power from one or more power sources;
power distribution circuitry having a first power configuration and a second power configuration and configured to distribute power from the first PEM to a first power zone of the backplane and power from the second PEM to a second power zone of the backplane;
switching circuitry configured to switch between the first power configuration and the second power configuration, thereby providing a flexible reconfigurable power arrangement;
a power configuration module (PCM) that can be plugged into at least one of the circuit board slots to distribute power to the circuit board slots, wherein, in the first power configuration, the PCM bridges circuit elements from the first PEM and the second PEM to provide balanced power to the at least three power zones of the backplane, including the first power zone and the second power zone;
wherein the backplane is capable of receiving a third PEM, and wherein, in the second power configuration, the third PEM provides power to a third power zone of the at least three power zones of the backplane.

2. The backplane system of claim 1, wherein the switching circuitry switches from the second power configuration to the first power configuration.

3. The backplane system of claim 1, wherein the circuit board slots are partitioned into the first power zone associated with the first PEM, the second power zone associated with the second PEM, and the third power zone associated with the third PEM, and wherein the PCM acts as a jumper in the first power configuration to bypass missing circuitry associated with the third PEM.

4. The backplane system of claim 1, wherein the circuit board slots are configured to receive the power primarily from the first PEM and secondarily from the second PEM.

5. The backplane system of claim 1, wherein the power entry modules comprise electromagnetic interference filters.

6. The backplane system of claim 1, wherein the power entry modules comprise circuit breakers.

7. The backplane system of claim 1, wherein the switching circuitry comprises a jumper.

8. The backplane system of claim 1, further comprising a keying mechanism configured to prevent coupling an incompatible device with the backplane system operating in the first power configuration or the second power configuration.

9. A method for distributing power in a backplane system, the method comprising:
receiving power in a first power entry module (PEM) and a second PEM;
selecting a first power configuration or a second power configuration for a backplane, wherein, the ability to select a first power configuration or a second power configuration provides a flexible reconfigurable power arrangement;
in accordance with the first power configuration:
plugging a power configuration module into a circuit board slot coupled to the backplane;
receiving power from the first PEM and the second PEM in the power configuration module;
distributing the power from the power configuration module to the backplane;
in accordance with the second power configuration:
plugging a third PEM into said circuit board slot coupled to the backplane;
receiving power in the third PEM;
providing power from the first PEM to a first power zone on the backplane;
providing power from the second PEM to a second power zone on the backplane;
providing power from the third PEM to a third power zone on the backplane.

10. The method of claim 9; further comprising switching from the second power configuration to the first power configuration.

11. The method of claim 9, further comprising:
receiving the power from the power distribution circuitry;
distributing the power to a first group of circuit board slots associated with the first power zone; and
distributing the power to a second group of circuit board slots associated with the second power zone.

12. The method of claim 9, further comprising:
receiving the power from the power distribution circuitry;
distributing the power to a first group of circuit board slots associated with the first power zone;
distributing the power to a second group of circuit board slots associated with the second power zone; and
distributing the power to a third group of circuit board slots associated with the third power zone.

13. The method of claim 9, further comprising:
receiving the power in the backplane primarily from the first PEM; and
receiving the power in the backplane secondarily from the second PEM.

14. The method of claim 9, further comprising electromagnetic interference filtering the power.

15. The method of claim 9, further comprising providing over current protection of the power.

16. The method of claim 9, switching a jumper to switch from the first power configuration to the second power configuration.

17. A backplane system comprising:
a backplane divided into a plurality of power zones;
a circuit board slot coupled to the backplane;
means for providing power to the backplane;
means for distributing the power to the backplane in a first power configuration and a second power configuration;
a power configuration module that can be plugged into the circuit board slot to act as a jumper between a first power entry module (PEM) and a second PEM of the means for distributing power to the backplane, and distribute the power to the plurality of power zones;
means for switching between the first power configuration and the second power configuration, thereby providing a flexible reconfigurable power arrangement,
wherein the circuit board slots are configured to receive a separate non-current shared isolated power feed from the first PEM and the second PEM in a cross-connected manner that ensures continuously available service.

18. The backplane system of claim 17, wherein the means for switching switches from the second power configuration to the first power configuration.

19. The backplane system of claim 17, wherein circuit board slots are partitioned into a first power zone and a second power zone of the plurality of power zones.

20. The backplane system of claim 17, wherein circuit board slots are partitioned into a first power zone, a second power zone and a third power zone of the plurality of power zones.

21. The backplane system of claim 17, wherein circuit board slots are configured to receive power primarily from the first PEM and secondarily from the second PEM.

22. The backplane system of claim 17, wherein the means for distributing the power further comprises electromagnetic interference filters.

23. The backplane system of claim 17, wherein the means for distributing the power further comprises circuit breakers.

24. The backplane system of claim 17, wherein the means for switching further comprises a jumper.

25. The backplane system of claim 1, wherein the circuit board slots are configured to receive a separate non-current shared isolated power feed from the first PEM and the second PEM in a cross-connected manner that ensures continuously available service.

26. The method of claim 9, further comprising receiving a separate non-current shared isolated power feed from the first PEM and the second PEM in a cross-connected manner that ensures continuously available service.

* * * * *